United States Patent [19]

Salzwedel et al.

[11] Patent Number: 5,675,591
[45] Date of Patent: Oct. 7, 1997

[54] REVERSE CHECKSUM METHOD FOR TELECOMMUNICATION SYSTEMS

[75] Inventors: Mark D. Salzwedel, Haltom City; Gerardo Saqueton, Fort Worth, both of Tex.

[73] Assignee: Motorola, Inc., Schaumburg, Ill.

[21] Appl. No.: 522,483

[22] Filed: Aug. 31, 1995

[51] Int. Cl.$^6$ .................................................. H03M 13/00
[52] U.S. Cl. .................................................. 371/53
[58] Field of Search .................................. 371/37.1, 53

[56] References Cited

U.S. PATENT DOCUMENTS

| 4,574,362 | 3/1986 | Spindel et al. | 364/900 |
|---|---|---|---|
| 4,698,805 | 10/1987 | Sasuta et al. | 370/97 |
| 5,010,553 | 4/1991 | Scheller et al. | 371/35 |
| 5,111,465 | 5/1992 | Edem et al. | 371/54 |
| 5,495,416 | 2/1996 | Buchwitz et al. | 364/449 |

OTHER PUBLICATIONS

European Telecommunication Standard, Radio Equipment and Systems (RES); Digital European Cordless Telecommunications (DECT) Common Interface, Part 4: Data Link Control Layer, PR ETS 300 175-4, 2nd ed., Draft Jan. 1995, pp. 1-157.

*Primary Examiner*—Stephen M. Baker
*Attorney, Agent, or Firm*—John G. Rauch

[57] ABSTRACT

A method for synchronizing communication between a transmitting unit (102) and a receiving unit (104) in a telecommunication system (100) includes calculating a reverse checksum for the received data. At the transmitting unit (102), data including a length indicator is serially transmitted. At the receiving unit (104), the data are received and stored in a buffer. A checksum is calculated beginning with the last-received data while maintaining a length count. When the checksum verifies and when the length count matches the transmitted length indicator, the received data is considered valid and communication is considered synchronized.

20 Claims, 2 Drawing Sheets

005,675,591

REVERSE CHECKSUM METHOD FOR TELECOMMUNICATION SYSTEMS

FIELD OF THE INVENTION

The present invention relates generally to telecommunication systems. The present invention relates more particularly to synchronization of communication between a transmitting unit and a receiving unit in a telecommunication system.

BACKGROUND OF THE INVENTION

For transmission of bits of digital data between a first unit and a second unit in a telecommunication system, the bits of data are commonly grouped in bytes, the bytes are grouped in segments, the segments are grouped in frames and frames are transmitted in a window of data. The relationship between these data structures are defined by a telecommunications protocol. An example of such a protocol is the Digital European Cordless Telecommunication (DECT) standard.

For reliable communication, reception of the data by the receiving unit must be synchronized with the transmission of the data by the transmitting unit. Synchronization occurs at different levels. Bit synchronization occurs when the receiving unit correctly recognizes the bit boundaries in the received data. Byte synchronization occurs when the receiving unit correctly recognizes the boundaries between bytes of received data. Synchronization also occurs similarly for segments and for frames.

One common approach to achieving frame synchronization in telecommunication systems is to append a checksum onto the end of the frame. The transmitting unit calculates the checksum by some operation, such as adding each of the data bits as they are serially transmitted. This checksum is then included in a predetermined location in the data, such as the last byte transmitted. The receiving unit includes a processor which computes a checksum using the same operation. If the computed checksum matches the received checksum, the received frame is considered to be valid. The receiving unit transmits an acknowledge signal and the transmitting unit transmits a subsequent frame of data. If the checksums do not match, the same frame is re-transmitted until the transmitting unit receives an acknowledgment from the receiving unit.

To correctly calculate a checksum for the received data, the receiving unit needs to know how much data, in segments or bytes, was transmitted. To indicate the amount of data transmitted, the transmitting unit also includes a length indicator with the transmitted data. The length indicator defines the number of bits or bytes of the transmitted data record. The transmitting unit places the length indicator in a predetermined location in the data stream, for example, at the third byte of the first segment of the frame.

Upon receiving the data, the receiving unit locates the length indicator at the predetermined location in the received data. Also, the receiving unit calculates the checksum starting with the first received byte. As it calculates the checksum, the receiving unit maintains a length count of the number of bits or bytes received. When the length count matches the received length indicator, the receiving unit determines if the calculated checksum matches the received checksum. Frame synchronization is achieved only if the checksums match for the same data record length.

If the checksums or lengths do not match, the receiving unit discards the first segment of the frame and assumes the next segment is the first segment of the frame. The receiving unit then reads the length indicator and computes the checksum over the amount of data indicated by this length indicator. This process continues until the checksums coincide and communication is again synchronized.

This method of synchronizing communications can create a substantial processing burden for the receiving unit. As an example, in communications according to the DECT protocol, the Data Link Control (DLC) layer communicates using frames which may include up to fourteen data segments. If the first segment, which contains the length field for the frame, is not received by the receiving unit, the receiving unit assumes that the second segment was the first and mistakenly reads what it assumes to be the length field from the second segment. The receiving unit proceeds normally to compute a checksum over the amount of data indicated by this incorrect length field. When the computed checksum does not match the received checksum, the receiving unit reads the next or third segment. Again, the checksums do not match. This process continues for up to fourteen total segments until the frame was re-transmitted and the initial segment is correctly identified. At that time, the correct frame length is read and the checksum correctly calculated.

This scenario for the DECT protocol results in a maximum of (14+13+12+ . . . +1)=105 iterations per segment received, assuming that the operation is executed once each time a new segment is received. Each iteration consists of several additions in order to compute the checksum over a segment. In the case of DECT, each segment consists of five "octets" or bytes and the checksum algorithm requires two additions per octet, resulting in a total of ten additions per segment. Therefore, this previous checksum calculation operation may result in up to fourteen synchronization attempts with up to 1050 additions per attempt.

Such a level of computation may be impossible for the receiving unit to accomplish, given other system considerations. The receiving unit must store partial checksums for each potential start-of-frame as the receiving unit waits for more data. The required memory may not be available. The falsing rate, which is the likelihood that the calculated checksum will falsely indicated correctly received data, may be unacceptably high using the conventional method of checksum determination. Further, the time permitted by other system operations requiring the processor may limit the time permitted for checksum calculations.

Therefore, there is a need in the art for a method for accurately and rapidly determining a checksum and thereby establishing frame synchronization in a telecommunications system.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction the accompanying drawings, in the several figures of which like reference numerals identify identical elements, and wherein:

DESCRIPTION OF THE PREFERRED EMBODIMENTS

Figure 1:
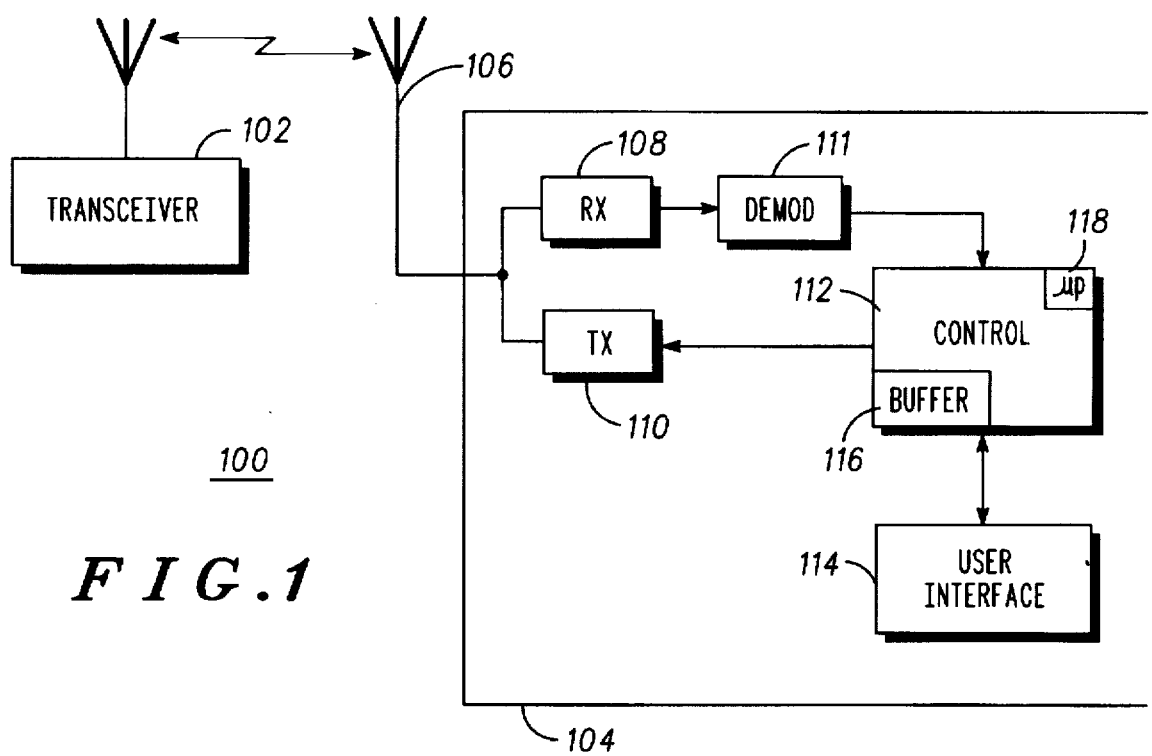
FIG. 1 is an illustration in block diagram form of a radiotelephone communication system which may employ the present invention.

FIG. 1 is an illustration in block diagram form of a telecommunication system or radiotelephone communication system 100. The radiotelephone communication system 100 includes a first unit or remote transceiver 102 and a second unit such as one or more radiotelephone handsets such as radiotelephone handset 104. The remote transceiver 102 sends and receives radio frequency (RF) signals to and from radiotelephone handsets within a fixed geographic area. The RF signals include digital data transmitted serially and modulated by a carrier frequency. The radiotelephone handset 104 is one such radiotelephone handset contained within the geographic area. The radiotelephone handset 104 includes an antenna 106, a receiver 108, a transmitter 110, a demodulator 111, a controller 112 and a user interface 114.

Upon reception of RF signals, the radiotelephone handset 104 receives the RF signals through the antenna 106. The antenna 106 converts the received RF signals into electrical baseband signals. The demodulator 111 demodulates the electrical baseband signals, recovers the data transmitted on the RF signals and provides the data to the controller 112. The controller 112 formats the data into recognizable voice or information for use by user interface 114. The user interface 114 communicates the received information or voice to a user. Typically, the user interface includes a display, a keypad, a speaker and a microphone (not shown).

Upon transmission of radio frequency signals from the radiotelephone handset 104 to the remote transceiver 102, the user interface 114 transmits user input data to the controller 112. A controller 112 formats the information obtained from the user interface 114 and transmits it to the transmitter 110 for conversion into RF modulated signals. The transmitter 110 conveys the RF modulated signals to the antenna 106 for transmission to the remote transceiver 102.

The controller 112 includes a receive data buffer 116 and a processor 118. Demodulated data received from the &modulator are stored in the receive data buffer 116 for processing by the processor 118. One operation performed by the controller 112 is verifying that the data received and stored in the receive data buffer is received accurately. A further function of the controller 112 is establishment of frame synchronization.

Preferably, the transceiver 102 transmits data to the radiotelephone handset 104 one frame at a time. The frames are subdivided into one or more segments of data. For example, the system 100 may operate according to the Digital European Cordless Telecommunication (DECT) protocol, as defined in "Radio Equipment and Systems; Digital European Cordless Telecommunications Common Interface Part 4: Data Link Control Layer," ETS 300 175-4 (1995) published by the European Telecommunications Standards Institute, which is incorporated herein by reference. Alternatively, the system 100 may operate according to the Personal Handy Phone System (PHS) protocol, used in Japan, or any other data communication protocol for cordless or cellular telephone systems.

Figure 2:
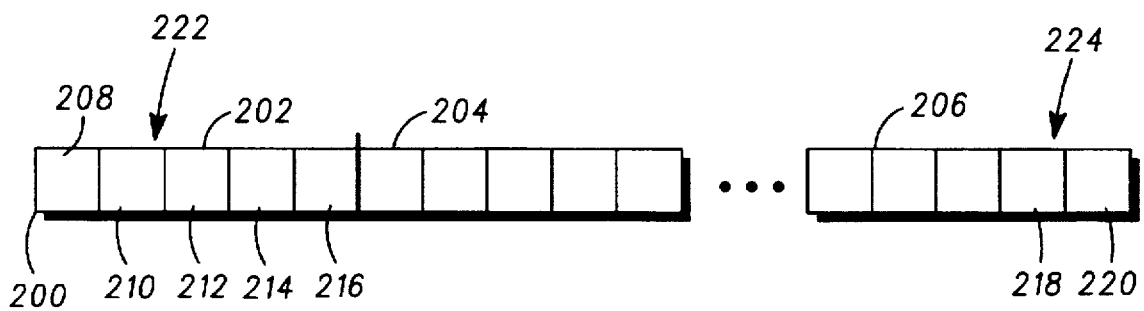
FIG. 2 is an illustration showing a frame format for transferring data in the radiotelephone communication system of FIG. 1.

FIG. 2 is an illustration showing a frame format for transferring data in the radiotelephone communication system 100 of FIG. 1. In FIG. 2, a frame 200 of data includes an initial segment 202, a second segment 204 and a final segment 206. The frame 200 may include any number of segments. For example, in a DECT system, the frame 200 may include from 1 to 14 segments. In a frame including 14 segments, the initial segment 202 is the first segment transmitted by the transceiver 102 (FIG. 1) and the final segment 206 is the fourteenth segment transmitted by the transceiver 102. Because of noise or other reasons, all of the transmitted segments 202, 204, 206 of the frame 200 may not be received by the radiotelephone handset 104.

Each of the segments 202, 204, 206 of the frame 200 includes a predetermined number of bytes of data. For example, initial segment 202 includes bytes 208, 210, 212, 214, 216. The telecommunications protocol, such as DECT, which controls communications in the system 100 defines the number of bytes (such as 5 in DECT) included in each segment.

The protocol also defines predetermined bytes of predetermined segments which are used for conveying information about the frame 200 from the transceiver 102 to the radiotelephone handset 104. For example, according to DECT, the third byte of the initial segment 202, or byte 210 in FIG. 2, includes a length indicator 222. The length indicator 222 may correspond to the number of bytes in the frame 200 or, in DECT, it may correspond to the number of higher-layer bytes in the frame. Also, according to DECT, the final two bytes 218, 220 of the final segment 206 contain a checksum 224 for the frame. According to other protocols, the length indicator 222 and the checksum 224 bytes may be located elsewhere in the frame 200. The length indicator 222 and the checksum 224 are used by the processor 118 (FIG. 1) to establish frame synchronization with the transceiver 102.

The frame 200 may be one of several types of frame. For example, the frame 200 may be an information frame, including data along with control information such as the length indicator and the checksum. Alternatively, the frame 200 may be an acknowledgment frame which includes a single segment conveying an acknowledgment signal indicating successful receipt of transmitted data.

Figure 3:
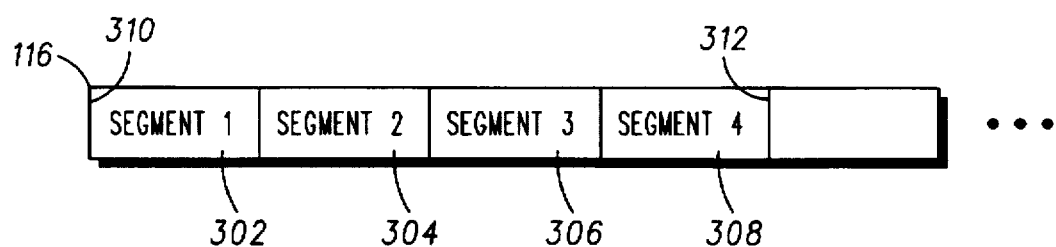
FIG. 3 is an illustration showing the receive data buffer of the radiotelephone handset of FIG. 1.

Each received frame such as frame 200 is stored in the receive data buffer 116 for processing by the processor 118. FIG. 3 is an illustration showing the receive data buffer of the radiotelephone handset of FIG. 1 after receipt of a frame of data such as frame 200. As the data are received by the radiotelephone handset 104, the data are sequentially written into the receive data buffer 116. The initial segment 302 is written to the receive data buffer, followed by the second segment 304 and the third segment 306 and the final segment 306. Receiving and storing continues until all segments from the frame are received. The first-received data are stored at an initial location 310 and the last-received data are stored at a final location 312. The number of segments stored will depend on the number of segments transmitted and the number of segments received.

The processor 118 begins calculating a checksum to verify accurate reception of the frame. A method for calculating the checksum in accordance with the present invention will be described below in conjunction with FIG. 4. If the calculated checksum matches the checksum 224 (FIG. 2) included by the transceiver 102 in the frame 200, the frame is considered valid and communication between the transceiver 102 and the radiotelephone handset 104 is considered to be synchronized. If the calculated and transmitted checksums do not match, the processor determines that an error occurred and awaits re-transmission of the frame 200.

In accordance with the present invention, the processor 118 may begin calculating the checksum in response to a predetermined data reception indicator. For example, the controller 112 may detect a pause in reception of data. The pause may occur, for example, if the predetermined window size is set equal to one frame. The detected pause provides an indication that an entire frame of data has been received and that calculation of the checksum may begin. The predetermined data reception indicator thus decreases the likelihood of falsely detecting an invalid frame as valid and reduces the amount of processing required by the processor 118.

Figure 4:
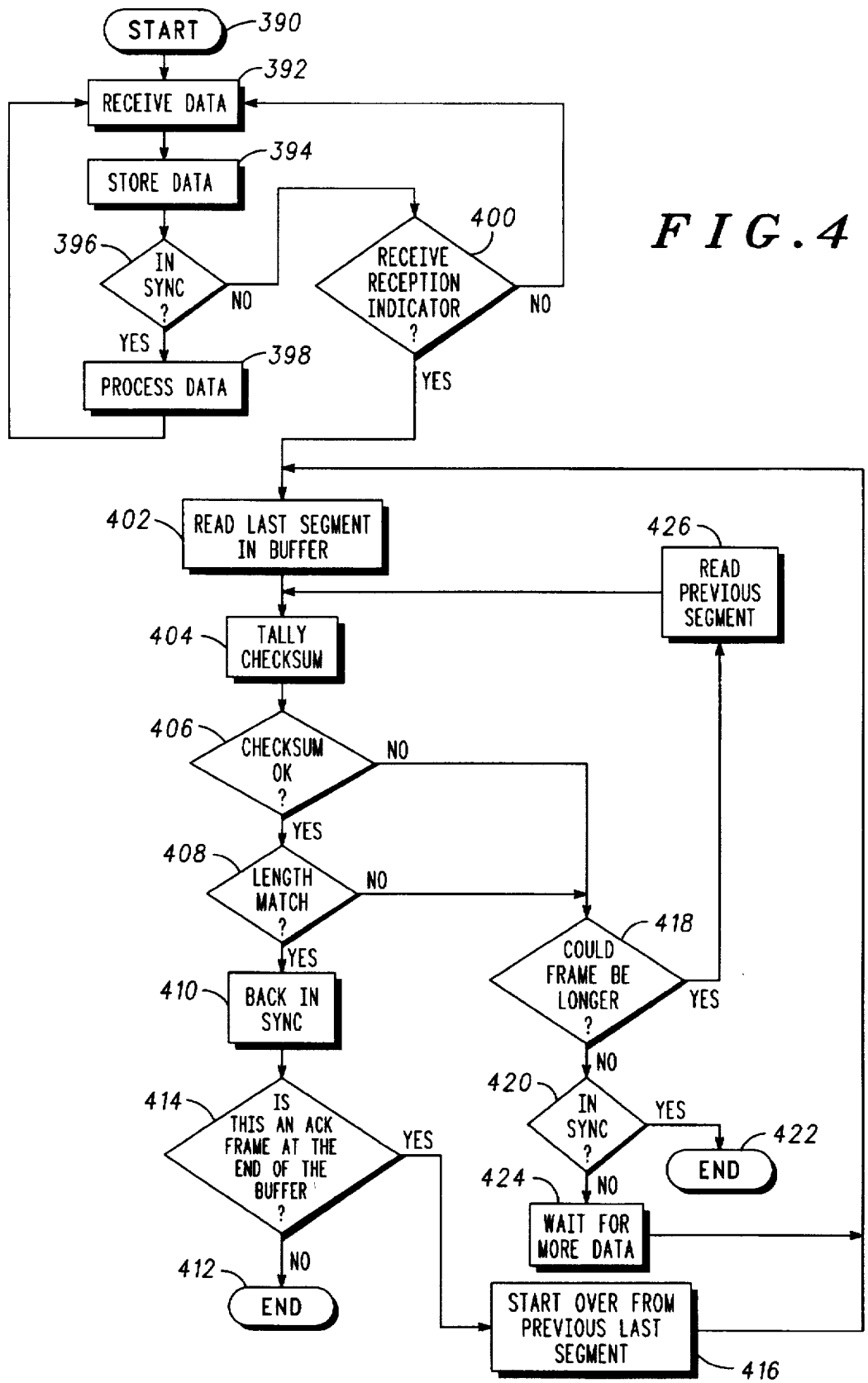
FIG. 4 is a flow diagram illustrating operation of the method of the present invention.

FIG. 4 is a flow diagram illustrating operation of the method of the present invention. The method begins at step 390. The method may begin in response to an initiation of communication by the transceiver 102 (FIG. 1), in response to a detected loss of synchronization in communication between the transceiver 102 and the radiotelephone handset 104, or in response to a predetermined data reception indicator. In either case, the radiotelephone handset 104 begins at step 390 to establish synchronization.

At step 392, the radiotelephone handset 104 receives data. The data are demodulated and conveyed to the controller 112 (FIG. 1). At step 394, the controller 112 stores the data in the receive data buffer 116. The controller 118 determines at step 396 if communication between the transceiver 102 and the radiotelephone handset 104 is synchronized. If communication is synchronized, the controller 112 step 398 processes the data. Control then returns to step 392 for reception of additional data. If, at step 396, communication was not synchronized, control proceeds to step 400 to determine if a predetermined data reception indicator has been received.

The predetermined data reception indicator may be any predetermined pattern or feature of the received data which allows the controller 112 to determine that the end of a frame of data has been received. One example is a pause in the reception of data for a predetermined time interval. Another example is a predetermined data signature, such as two consecutive bytes of identical data, such as all binary 1s. By detecting the predetermined data reception indicator, the controller 112 knows with a high degree of likelihood it has received the last segment of the transmitted frame. Since, according to the present invention, a checksum for the data is calculated beginning with the last-received data, knowledge that the buffer contains the last segment of the frame increases the likelihood of correct calculation of the checksum, reduces the number of calculations necessary and improves the speed of checksum calculation and establishment of synchronization.

If the handset has not received the predetermined data reception indicator, execution returns to step 392 to continue receiving data. If the handset has received the predetermined data reception indicator, execution proceeds to step 402 to begin calculation of the checksum.

At step 402, the processor 118 reads the last segment of data stored in the receive data buffer 116. The last segment of data is the final-received segment which was received most recently in time by the radiotelephone handset 104. Thus, as illustrated in FIG. 3, the processor reads final segment 308.

At step 404, the processor 118 tallies a checksum for the last segment of data. The checksum may be tallied by any appropriate method. For example, in one possible embodiment, the processor sums all data bits stored in the receive data buffer 116 from the final location 312 to and including the first bit of final segment 308 (FIG. 3). As another example, the checksum 224 stored in bytes 218, 220 (FIG. 2) may be arranged so that, upon summing bits in the frame up to a length indicated by length indicator 222, the calculated checksum totals a predetermined value, such as 0. Other checksum calculation techniques may be similarly applied with the restriction that the technique produces a calculated checksum which verifies the checksum produced from the same data by the transceiver 102 and included with the frame. While calculating the checksum, the processor 118 maintains a length count corresponding to the amount of data read from the receive data buffer 116 and included in the checksum.

At step 406, the processor 118 reads the checksum from the frame and verifies the calculated checksum. Verifying the calculated checksum depends on the nature of the checksum calculation operation implemented in step 404 and may include, for example, comparing the calculated checksum with the transmitted checksum 224 or comparing the calculated checksum with the predetermined value, such as 0.

At step 408, the processor 118 reads what it perceives to be the length indicator for the frame. That is, the processor 118 looks for a length indicator in the predetermined location defined for the length indicator. For example, in a DECT system, the processor 118 would look for the length indicator at the third byte of segment 308 (FIG. 3). The processor 118 determines if the length count matches the perceived length indicator. If the two lengths match, the processor 118 determines at step 410 that the radiotelephone handset 104 accurately received the entire frame 200 of data and that communication with the transceiver 102 is now back in synchronization. The method may proceed now to terminate at step 412.

Optionally, the method may determine at step 414 if the frame 200 is an acknowledgment frame stored at the end of the buffer. An acknowledgment frame is a frame transmitted in response to verification of a received frame to tell the transmitting unit that the frame was accurately received. If no acknowledgment frame is received, the transmitting unit re-transmits the frame. In most protocols, including, for example, DECT, acknowledgment frames are a single segment in length.

Even in the case of a system using a window size of 1 frame, it is possible that an unnumbered acknowledgment frame could be received and stored in the receive data buffer 116 along with a numbered information frame. An acknowledgment frame may be received in one of three positions: before a complete valid information frame; after a complete valid information frame; or between an invalid information frame and a partially received information frame. In the first case, the acknowledgment frame is irrelevant because the proper acknowledgment can be inferred from the subsequently received information frame.

To distinguish two frames stored in the receive data buffer 116, the processor preferably maintains two checksums. One checksum is a single element checksum performed to identify acknowledgment frames, and one checksum is a multi-segment checksum starting with the final segment in the buffer to identify information frames. If the final segment of the frame is found to be an acknowledgment frame, the method must continue searching for an information frame beginning with the next-to-last segment of the buffer. In some applications, the checksum for the information frame may be calculated by adding the checksum for the next-to-last segment to the checksum for the final segment.

Thus, the method determines at step 414 if the frame 200 is an acknowledgment frame stored at the end of the buffer.

If it is an information frame or an acknowledgment frame not at the end of the buffer 116, the method ends at step 412 and communication is synchronized. If the frame 200 is an acknowledgment frame at the end of the buffer 116, the method continues at step 416 by searching for an information frame preceding the acknowledgment frame in the receive data buffer. Control returns to step 402 where the last segment is read and checksum calculation and verification proceeds as described above for the information frame.

If at step 406, while trying to identify an information frame, the processor 118 was unable to verify the checksum, or if at step 408 the length count did not match the transmitted length indicator, control proceeds to step 418. The processor 118 determines if the frame could be longer, i.e., could include more segments than have been read to this point. For example, in DECT, the maximum frame size is 14 segments. If 14 segments have been read from the receive data buffer 116, the frame can not include any more unread segments. Control then continues to step 420 to determine if communication was previously (step 410) determined to be synchronized. If so, execution ends at step 422. If not, at step 424, the processor awaits receipt of the re-transmitted frame and execution continues at step 402. If at step 418, the processor determined that the frame could include additional segments, control proceeds to step 426 where the previous segment is read from the receive data buffer 116 and to step 404 for calculation of the checksum.

As can be seen from the foregoing, the present invention provides for calculation of a checksum starting from the end or last-received data of a frame of received data and moving backward. This is in contrast to the conventional forward calculation, which starts at the beginning or first-received data of a frame. The method according to the present invention substantially reduces the number of iterations needed when two communicating units are not in frame synchronization and reduces the likelihood of falsely indicating a correct result of the checksum calculation.

This improved performance can be demonstrated by an example using a DECT system. In such an application, the method according to the present invention results in a maximum of fourteen iterations per received segment, since the checksum does not have to be recalculated from scratch after every failed attempt. There may be up to 2×14−1=27 synchronization attempts, since the method begins by assuming that the second segment received is the last segment of the frame, then the third, etc.. Since there is no need to check for frames which begin before the last frame ended, the first thirteen attempts will have a maximum of 1, 2, . . . , 13 iterations. This may be followed by fourteen attempts with a maximum of 14 iterations. Thus the maximum number of iterations to regain synchronization is (1+2+. . . +13+(14×14))=287. This is a substantial improvement over the 14 synchronization attempts requiring up to 1050 additions per attempt described above in conjunction with the conventional checksum method. Substantially less time and processor commitment is required to perform the method of the present invention.

The improved performance provided by the method of the present invention can be further demonstrated by the following example. The example is based on the following assumptions: use of the DECT DLC protocol; a 7 segment frame; the first segment of the original transmission is not received. Assuming the first segment is lost, there will be six opportunities for false positives (the six remaining segments of the original frame will all be considered to be the first of a frame). Using the conventional forward checksum method, there is a fifty percent chance that the incorrectly read length indicator will be accepted (i.e., it would not be accepted if it indicated a length greater than an allowed maximum). If it is accepted, there is a $(1/256) \times (1/256) = 1.5 \times 10^{-5}$ chance that the checksum bytes will falsely indicate a correct result. Therefore, the overall probability of a false positive for fids scenario is $6 \times (1/2) \times (1/256) \times (1/256) = 4.58 \times 10^{-5}$.

Applying the method according to the present invention, the probability of the first-received segment resulting in a false positive is the same as above, since loss of synchronization has not yet been detected, and is $(1/2) \times (1/256) \times (1/256) = 7.63 \times 10^{-6}$. At this time, the method detects loss of synchronization and begins searching from the end of the receive data buffer 116. For a transmitted frame of 7 segments, the method will skip over the five intermediate segments and begin attempting to gain synchronization with the last segment in the buffer 116. As a result, the method will be attempted seven times. The first attempt will assume that what is actually the first segment of the re-transmitted frame is the last segment. The method will proceed six more times until it is correct in assuming that the last segment of the re-transmitted frame is in fact the last segment.

For each attempt, the method will back up until it reaches the start of the buffer 116. Thus, for the first attempt, there will be six questionable segments in the buffer 116 (the first segment of the re-transmitted frame, plus the last five segments of the original transmission). Similarly, the subsequent attempts by the method will have 7, 8, 9, 10, 11, and 11 opportunities for false positives (the last will have only 11 because the twelfth will be correct). For each checksum which produces a false positive, the method will verify that the length indicator matches the actual length count. If random, this match will have a probability of 1/128. Therefore the overall probability of a false positive using the method according to the present invention is $(6+7+8+9+10+11+11) \ast (1/256) \ast (1/128) = 7.39 \times 10^{-6}$. This is a substantially improved performance relative to the conventional method analyzed above.

Moreover, the method according to the present invention requires much less on-board memory for use by the processor for checksum calculation, relative to the conventional method. The conventional method must store partial checksums for each potential start-of-frame as the radiotelephone waits for receipt of more data. Such partial checksums are not calculated and need not be retained by a handset operating according to the present invention.

While a particular embodiment of the present invention has been shown and described, modifications may be made. For example, while the invention has been described as operating according to the DECT protocol, the method and apparatus of the present invention could similarly operate according to other telecommunications protocols, such as PHS and other cordless or cellular standards. Similarly, the method of the present invention could be used in any data system where data are transmitted from a first unit to a second unit, whether by telecommunications or by wireline transfer. It is therefore intended in the appended claims to cover all such changes and modifications which fall within the true spirit and scope of the invention.

What is claimed is:

1. A method for synchronizing communication between a first unit and a second unit in a telecommunication system, the method comprising the steps of:

at the first unit:
serially transmitting data, the data including a length indicator and a checksum;

at the second unit:

receiving the data including the length indicator;

storing the data in a buffer, including storing first-received data at an initial location and storing last-received data at a final location;

storing the length indicator at a predetermined location;

beginning at the final location, calculating a calculated checksum while maintaining a length count;

verifying the calculated checksum; and synchronizing communication if the length count matches the length indicator.

2. A method as recited in claim 1 wherein the length indicator corresponds to a number of bytes of data transmitted and wherein the step of maintaining the length count includes counting a number of bytes of data stored in the buffer as each byte of data is read from the buffer.

3. A method as recited in claim 1 wherein the transmitting step includes transmitting a window of data including a single frame of data, the single frame including one or more segments of data, each of the one or more segments including a predetermined number of bytes of data and wherein the calculating step includes the step of reading from a received frame of data a segment of data and calculating the checksum for the segment of data, and wherein the step of verifying the checksum includes comparing the checksum with a predetermined value and determining the checksum to be verified if the checksum matches the predetermined value.

4. A method as recited in claim 3 wherein the method further comprises the steps of, if the checksum is not determined to be verified, reading a previously-received segment of data if the received frame of data could include more data than has been read and calculating the checksum using the previously-received segment of data.

5. A method as recited in claim 1 wherein the method further includes the step of, at the second unit, detecting a predetermined data reception indicator and calculating the checksum in response to detection of the predetermined data reception indicator.

6. A method as recited in claim 5 wherein the predetermined data reception indicator comprises a pause in reception of the data.

7. A method as recited in claim 1 wherein the data is stored serially by units and wherein the step of calculating the calculated checksum includes reading a first unit of data from the final location, reading a second unit of data from a next-to-last location immediately preceding the final location, summing the first and second unit to produce the calculated checksum, reading a third unit of data from a location immediately preceding the next-to-last location and adding the third unit of data to the calculated checksum to produce the calculated checksum.

8. A method as recited in claim 7 where the units comprise bytes.

9. A method as recited in claim 7 wherein the step of verifying the checksum includes the step of comparing the calculated checksum with a predetermined value and determining the checksum to be verified if the checksum matches the predetermined value.

10. A method as recited in claim 9 wherein the predetermined value is 0.

11. A method as recited in claim 9 wherein, if the calculated checksum does not match the predetermined value, the method further comprises the step of reading a fourth unit from a location immediately preceding the location containing the third unit, adding the fourth unit to the calculated checksum to produce the calculated checksum.

12. A method for verifying received data in a telecommunication device, the telecommunication device receiving data from a remote transmitter, the data being organized in one or more segments, the data including a length indicator, the method comprising the steps of:

reading a final segment of data, the final segment being a last-received segment of the one or more segments;

calculating a checksum for the final segment;

maintaining a length count while calculating the checksum, the length count being indicative of an amount of data over which the checksum is calculated;

verifying a checksum;

identifying the final segment of data as valid if the length count and the length indicator match;

determining if the final segment of data includes as acknowledgment message;

if the final segment of data includes an acknowledgment message, reading a next-to-last segment of data, the next-to-last-segment being a segment received immediately preceding receipt of the final segment of data;

calculating an information frame checksum for the final segment and the next-to-last segment;

maintaining an information frame length count while calculating the information frame checksum;

verifying the information frame checksum; and identifying the final segment and next-to-last segment as valid if the information frame length count matches the length indicator.

13. A method for verifying received data as recited in claim 12 wherein the step of verifying the checksum includes comparing the checksum with a predetermined value and determining the checksum to be valid if the checksum matches the predetermined value.

14. A method for verifying received data as recited in claim 12 wherein the step of reading the final segment of data includes the step of reading a transmitted checksum received from the remote transmitter and wherein the step of calculating the checksum includes using the transmitted checksum for calculating the checksum, and wherein the step of verifying the checksum includes comparing the calculated checksum with a predetermined value.

15. A method for verifying received data as recited in claim 12 wherein the method further comprises the steps of, if the information frame length count does not match the length indicator, determining if the received data could include an additional segment of data, reading the additional segment of data, and recalculating the information frame checksum using the additional segment of data and verifying the information frame checksum.

16. A method for verifying received data as recited in claim 12 wherein the method further comprises the steps of, if the information frame checksum does not verify, determining if the received data could include an additional segment of data, reading the additional segment of data, and recalculating the information frame checksum using the additional segment of data and verifying the information frame checksum.

17. A radiotelephone handset configured for radio communication with a remotely located transceiver, the radiotelephone handset comprising:

an antenna configured to detect radio signals transmitted by the remotely located transceiver;

a receiver coupled to the antenna for receiving the detected radio signals;

a demodulator coupled to the receiver for demodulating the received radio signals to produce received data, the received data including first-received data and last-received data, the received data being organized in one or more segments including a last-received segment of data, the received data further including a length indicator indicative of an amount of data transmitted by the remotely located transceiver; and a controller coupled to the demodulator for processing the received data, the controller including a receive data buffer for storing the received data, the controller storing the first-received data in an initial location and the last-received data in a final location, the controller reading the last-received segment of data including the last-received data from the receive data buffer, the controller calculating a checksum for the last-received segment of data and maintaining a length count indicative of the amount of data for which the checksum is calculated, the radiotelephone handset obtaining synchronized communication with the transmitter when the controller verifies the checksum and when the length count matches the length indicator.

18. A radiotelephone handset as recited in claim 17 wherein the controller includes a processor configured for calculating the checksum and for maintaining the length count.

19. A radiotelephone handset as recited in claim 18 wherein the processor is further configured for determining if the last-received segment of data includes an acknowledgment message, the controller reading a next-to-last segment if data in response to the acknowledgment message, the processor further being configured to calculate an information frame checksum for the last-received segment and the next-to-last segment and maintain an information frame length count, the radiotelephone handset obtaining synchronized communication with the remotely located transceiver when the controller verifies the information frame checksum and when the information frame length count matches the length indicator.

20. A method for synchronizing communication between a first unit and a second unit in a telecommunication system, the method comprising the steps of:

at the first unit:
serially transmitting data, the data including a length indicator and a checksum;

at the second unit:
receiving the data including the length indicator;
storing the length indicator at a predetermined location;
storing the data in a buffer, including storing last-received data at a final location;
detecting a predetermined data reception indicator, the predetermined data reception indicator including a pause in reception of the data;
in response to the predetermined data reception indicator and beginning at the final location, calculating a calculated checksum while maintaining a length count;
verifying the calculated checksum; and
synchronizing communication if the length count matches the length indicator.

* * * * *